(12) United States Patent
Friedrich et al.

(10) Patent No.: US 6,660,437 B2
(45) Date of Patent: Dec. 9, 2003

(54) ALTERNATING PHASE MASK

(75) Inventors: Christoph Friedrich, München (DE); Uwe Griesinger, Anzing (DE); Michael Heissmeier, München (DE); Burkhard Ludwig, München (DE); Molela Moukara, München (DE); Rainer Pforr, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/158,733

(22) Filed: May 30, 2002

(65) Prior Publication Data

US 2003/0008218 A1 Jan. 9, 2003

Related U.S. Application Data

(63) Continuation of application No. PCT/DE00/04136, filed on Nov. 22, 2000.

(30) Foreign Application Priority Data

Nov. 30, 1999 (DE) .......................................... 199 57 542

(51) Int. Cl.[7] .................................................. G03F 9/00
(52) U.S. Cl. ........................................................... 430/5
(58) Field of Search ............................. 430/5, 322, 323, 430/324; 716/19, 20, 21

(56) References Cited

U.S. PATENT DOCUMENTS

| 5,472,814 A | 12/1995 | Lin ................................. 430/5 |
| 5,523,186 A * | 6/1996 | Lin et al. ........................ 430/5 |
| 5,635,316 A | 6/1997 | Dao ............................... 430/5 |
| 5,840,447 A | 11/1998 | Peng .............................. 430/5 |
| 5,923,566 A | 7/1999 | Galan et al. ................. 364/489 |
| 5,942,355 A | 8/1999 | Brainerd et al. ............... 430/5 |
| 6,420,074 B2 * | 7/2002 | Wang et al. .................... 430/5 |

FOREIGN PATENT DOCUMENTS

| EP | 0 505 102 A1 | 9/1992 |
| EP | 0 653 679 A2 | 5/1995 |

OTHER PUBLICATIONS

"Sub–quarter–micron gate pattern fabrication using a transparent phase shifting mask" (Watanabe et al.), 8257 b Journal of Vacuum Science & Technology B9, 1991, No. 6, pp. 3172–3175.

* cited by examiner

Primary Examiner—S. Rosasco
(74) Attorney, Agent, or Firm—Laurence A. Greenberg; Werner H. Stemer; Gregory L. Mayback

(57) ABSTRACT

An alternating phase mask having a branched structure containing two opaque segments is described. Two transparent surface segments are disposed on both sides of the segments or the components thereof, respectively. The surface segments are provided with phases that are displaced by $180°\pm\Delta\alpha$, whereby $\Delta\alpha$ a is not more than 25°. The surface segments are separated by at least one transparent surface boundary segment whose phase is situated between the phases of the adjacent surface segments.

16 Claims, 2 Drawing Sheets

ALTERNATING PHASE MASK

CROSS-REFERENCE TO RELATED APPLICATION

This application is a continuation of copending International Application No. PCT/DE00/04136, filed Nov. 22, 2000, which designated the United States and which was not published in English.

BACKGROUND OF THE INVENTION

Field of the Invention

The invention relates to a phase mask for exposing a photosensitive layer in a photolithographic process. The phase mask contains a T-patterned structure composed of transparent surface segments with mutually displaced phases and a surface boundary segment whose phase is situated between the phases of the adjacent surface segments.

Such phase masks are used in photolithographic processes to produce integrated circuits, in particular to produce, conductor tracks for wiring integrated circuits.

Such conductor tracks are usually incorporated in isolator layers that are seated, directly or with the interposition of a metal layer, on a substrate that contains the integrated circuits. Such substrates usually are formed of silicon layers, while the isolator layers are formed of oxide layers, preferably made from silicon oxides.

Trenches, running in a plane or in a plurality of planes, and contact vias are incorporated in the isolator layer in order to produce the conductor tracks, it being preferred to use etching processes, in particular plasma etching processes, for this purpose.

In order to incorporate the trenches and contact vias into the isolator layer, a resist mask with a via pattern corresponding to the trenches and/or the contact vias is applied to the isolator layer. A plurality of resist masks are usually also applied successively in a multistage process, in order to incorporate contact vias and/or trenches in a plurality of planes of the isolator layer.

The individual trenches and contact vias are etched with prescribed depths through the corresponding openings in the resist masks. Thereafter, the resist masks are removed from the isolator layer. Finally, metal is deposited into the trenches and/or contact vias in order to produce the conductor tracks.

The production of resist masks on the isolator layers is performed by known photolithographic processes. The first step in this case is to apply a radiation-sensitive resist layer to the isolator layer. Radiation, in particular optical radiation, is applied to the resist layer at prescribed points by the application of stencils or the like. Thereafter, either only the exposed or only the unexposed regions of the resist layer are removed in a suitable developer. In the first case, a so-called positive resist is present, in the second case a negative resist is present. The resist layer with the via pattern thus generated then forms the resist mask for the subsequent etching processes.

In the exposure process, the beams, in particular light beams, are intended to be projected onto the surface of the resist layer as accurately as possible in accordance with a prescribed via pattern. The aim in this case is as high a resolution as possible, whose goal is to obtain as abrupt a transition as possible of exposed and unexposed points in the photoresist layer.

The exposure is performed in this case in such a way that the radiation source emits radiation that is focused via a lens onto an image plane in which the resist layer is located. Individual substrates with the resist layers applied thereon are positioned in the image plane by a stepper in the beam path of the beams emitted by the radiation source.

During the exposure, the radiation is guided through a mask, it being possible to prescribe a specific exposure pattern by the structure of the mask. The mask is usually constructed as a binary mask, for example in the form of a chrome mask. Such chrome masks have an alternating structure of transparent regions that are preferably formed by a glass layer, and nontransparent layers that are formed by the chrome layers.

A phase mask is used instead of a chrome mask in order to increase the contrast of exposed and non-exposed regions on the resist layer.

Such a phase mask can be constructed, in particular, as a half-tone phase mask. In such half-tone phase masks, the opaque layers are replaced by a semitransparent layer with a transmission of typically 6%, whose layer thicknesses are constructed such that the traversing radiation experiences a phase-angle deviation of 180°.

Furthermore, the phase mask can also be constructed as an alternating phase mask. Such an alternating phase mask has neighboring transparent regions, separated in each case by a chrome layer, which have phases respectively displaced by 180°. That is to say, the radiation traversing a transparent region is offset in phase by 180° by comparison with the radiation that is guided through a neighboring transparent region.

An exact and contrasty optical imaging is obtained with the aid of such alternating phase masks when, in particular, the chrome layers are disposed as chrome webs running parallel to one another at a spacing. The transparent regions then likewise form webs that run between the chrome webs and have alternating phases of 0° and 180°.

However, a structure of phase masks that have branched opaque segments constructed as chrome webs is problematical, two chrome webs forming a T-shaped structure in each case, in particular. With such a T-shaped structure, a second chrome web opens out at the longitudinal side of a first chrome web such that the first chrome web is subdivided into two partial segments. The transparent regions that surround the chrome webs are then to be constructed, in particular, as rectangular surface segments, the lengths and breadths of the surface segments being adapted in each case to the lengths of the adjacent opaque segments or parts thereof. The transparent surface segments are then preferably disposed such that in each case two surface segments situated opposite an opaque segment have phases differing by 180°. However, there are then always two surface segments remaining with phases differing by 180° that are directly adjacent. The light beams that pass the phase mask at the boundary line of these surface segments are extinguished by interference effects, the result of this being that a non-exposed zone is obtained on the resist layer in the corresponding position.

This entails a second exposure process, with the aid of which the zone must be exposed subsequently. This constitutes an undesired additional processing step, and thus an extra expenditure on time and costs.

U.S. Pat. No. 5,840,447 discloses a phase mask that has transparent surface segments with different phases. A periodic sub-wavelength structure is provided along the boundary line between two surface segments with different phases. The sub-wavelength structure contains alternating thin layers of materials for the two adjacent surface segments. The sub-wavelength structure results in a virtually continuous transition of the refractive index during the transition from one surface segment to another. Interference is thereby prevented from extinguishing light beams that penetrate the boundary line between the surface segments.

U.S. Pat. No. 5,635,316 discloses a phase mask that has a plurality of transparent surface segments with phases of 0° or 180°. Light beams that penetrate the boundary line between two surface segments of different phase are canceled by interference effects. A closed network of unexposed lines is obtained by a suitable configuration of the surface segments and of the boundary line structure thereby produced. A partial re-exposure of the unexposed lines is performed with the aid of a second mask in a second method step.

SUMMARY OF THE INVENTION

It is accordingly an object of the invention to provide an alternating phase mask which overcomes the above-mentioned disadvantages of the prior art devices of this general type, which has branched structures with a high contrast and a high imaging quality.

With the foregoing and other objects in view there is provided, in accordance with the invention, an alternating phase mask for exposing a photosensitive layer in a photolithographic process. The alternating phase mask contains at least two opaque segments including a first opaque segment with a longitudinal side and a second opaque segment ending at the longitudinal side of the first opaque segment. The second opaque segment subdivides the first opaque segment into two opaque partial segments on either side of an end region of the second opaque segment. Transparent surface segments are provided. One of the transparent surface segments is disposed on each side of each of the two opaque partial segments and of the second opaque segment and extend over an entire length of the opaque segments. Mutually adjacent ones of the transparent surface segments in each case have phases displaced by 180° ±$\Delta$ $\alpha$a with respect to each other, and $\Delta$ $\alpha$ being at most 25°. A surface boundary segment is disposed between two of the transparent surface segments and has a phase situated between the phases of the two of the transparent surface segments. The transparent surface segments separated by the surface boundary segment and situated opposite of the longitudinal side of the first opaque segment have phases displaced by 180°±$\Delta$ $\alpha$ with respect to each other. The surface boundary segment has a shape of an elongated rectangle with a width being substantially equivalent to a width of the second opaque segment.

The alternating phase mask according to the invention has at least two opaque segments, the first segment opening out at a longitudinal side of the second segment, and the first segment being subdivided into two partial segments on either side of an end region.

Disposed on either side of the partial segments and of the second segment over the entire length thereof in each case are two transparent surface segments that have phases displaced by 180°±$\Delta$ $\alpha$, $\Delta$ $\alpha$ being at most 25°.

The transparent surface segments that are situated opposite the longitudinal side of the first segment have a phase displaced by 180°±$\Delta$ $\alpha$ and are separated by at least one transparent surface boundary segment whose phase is between the phases of the adjacent surface segments. The phase of the surface boundary segment preferably corresponds to the arithmetic mean of the phases of the adjacent surface segments.

The surface boundary segment thus constructed prevents a negative interference of the radiation penetrating the boundary region between the adjacent surface segments. Consequently, the radiation is not canceled in the boundary region, and so the corresponding regions of the resist layer are exposed.

A re-exposure of these regions of the photoresist layer is thereby eliminated, and so a further exposure process for producing the desired structure of the resist mask can be avoided.

The surface boundary segment can be incorporated into the alternating phase mask without a large outlay on materials or costs.

Furthermore, it is advantageous that a contrasty image in a wide parameter range of the optical parameters of the imaging system is obtained with the aid of the phase mask according to the invention. In particular, a contrasty image is still obtained even when there is defocusing of the radiation penetrating the phase mask.

In accordance with an added feature of the invention, the two opaque segments complement one another and form a T-shaped structure. The T-shaped structure has a magnitude G where G=0.3·$\lambda$/NA, $\lambda$ being a wavelength of radiation used in an exposure, and NA being a numerical aperture of an imaging system used for the exposure. The two opaque segments each have a shape of an elongated rectangle. The first opaque segment at a side opposite the end region of the second opaque segment has an indentation formed therein extending over a width of the end region. Preferably, the two opaque segments are chrome webs.

In accordance with an additional feature of the invention, $\Delta$ $\alpha$=0°.

In accordance with another feature of the invention, the surface boundary segment transverse to boundary surfaces of adjacent ones of the transparent surface segments is divided up into partial segments having different phases. Alternatively, the surface boundary segment has a homogeneous phase.

In accordance with a further feature of the invention, the transparent surface segments have a rectangular cross-section. The transparent surface elements have lengths corresponding in each case to lengths of adjacent ones of the two partial opaque segments.

In accordance with a further added feature of the invention, the phases of the transparent surface segments are 0° or 180°, and the phase of the surface boundary segment is 90°. Alternatively, the phases of the transparent surface segments are 90° or 270° and the phase of the surface boundary segment is 0°.

In accordance with a concomitant feature of the invention, the surface boundary segment has a length adapted to lengths of adjacent ones of the transparent surface segments.

Other features which are considered as characteristic for the invention are set forth in the appended claims.

Although the invention is illustrated and described herein as embodied in an alternating phase mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
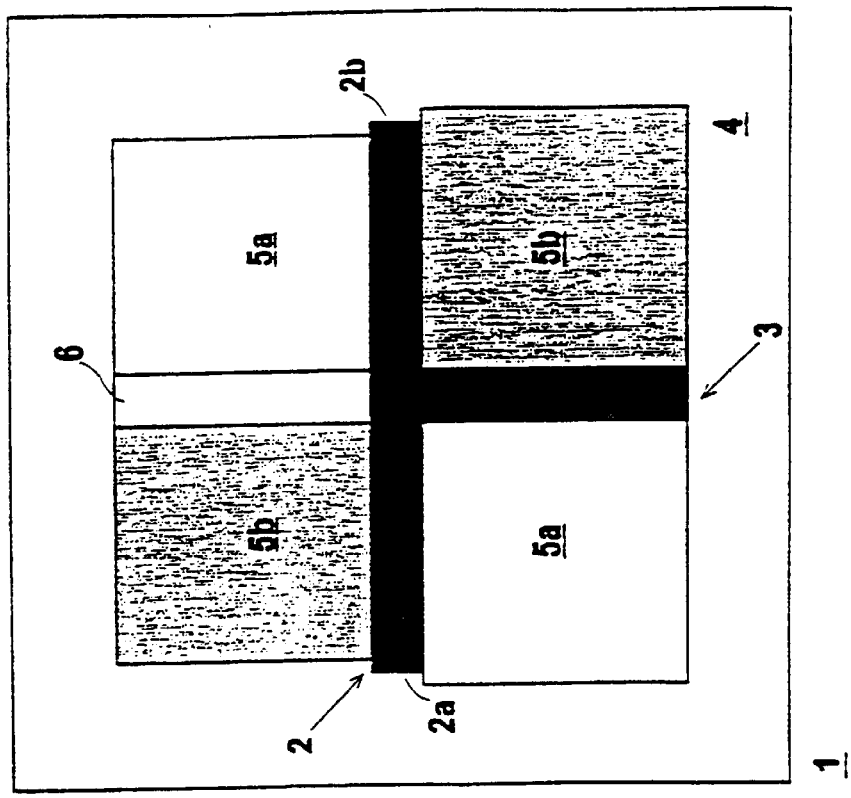
FIG. 1 is a diagrammatic, top plan view of a section of a first exemplary embodiment of a phase mask according to the invention.

Referring now to the figures of the drawing in detail and first, particularly, to FIG. 1 thereof, there is shown a first exemplary embodiment of a section of a phase mask 1 for exposing a photosensitive layer in a photolithographic process for producing integrated circuits.

The photosensitive layer is constructed, in particular, as a resist layer that is applied to an isolator layer, for example. The isolator layer is seated directly or with the interposition of a metal layer on a substrate that contains integrated circuits. The substrate preferably contains silicon. The isolator layer preferably is formed of a silicon oxide. Conductor tracks are incorporated into the isolator layer, trenches and contact vias into which metal is subsequently deposited being etched for the purpose of producing the conductor tracks according to a prescribed pattern.

The trenches and contact vias are incorporated into the isolator layer by an etching process preferably by a plasma etching process. For this purpose, at least one resist mask that has a via pattern corresponding to the trenches and contact vias is produced from the resist layer resting on the isolator layer. The incorporation of trenches and contact vias is performed by etching through the vias of the resist mask.

The production of the resist mask from the resist layer is performed by a photolithographic process. The resist layer is exposed for this purpose on prescribed layers and developed thereafter. The exposed or unexposed region of the resist layer are removed upon development, depending on whether the resist layer is a positive or negative resist.

A radiation source emitting radiation is provided for carrying out the exposure process. The radiation is focused onto the resist layer by a lens. A stopper is used to move the layer respectively to be exposed into the beam path of the radiation at the focal point of the lens. The phase mask 1 is provided in front of the lens.

A radiation source that is formed by a laser and emits coherent laser light beams as radiation is provided in the present exemplary embodiment.

A section from an exemplary embodiment of the alternating phase mask 1 according to the invention and in which two opaque segments 2, 3 are provided is illustrated in FIG. 1. The opaque segments 2, 3 are constructed as chrome webs 2, 3. The chrome webs 2, 3 are formed by thin layers that are applied to a transparent substrate 4 which is formed, for example, by a glass plate. Cross sections of the chrome webs 2, 3 in each case have the shape of elongated rectangles.

The second chrome web 3 opens out at the longitudinal side of the first chrome web 2 at a right angle, and so the two chrome webs 2, 3 complement one another to form a T-shaped structure. An end of the second chrome web 3 in this case subdivides the first chrome web 2 into two partial segments 2a, 2b. A size G of the T-shaped structure is approximately $G=0.3 \cdot \lambda / NA$. Here, $\lambda$ is the wavelength of the laser light beams used during exposure, and NA is the numerical aperture of the optical imaging system.

Provided in a fashion adjacent to the chrome webs 2, 3 are a total of four transparent surface segment 5a, 5b which form an essentially square configuration together with the chrome webs 2, 3. The surface segments 5a, 5b are disposed in this case such that in each case two of the surface segments 5a, 5b are opposite one another about a partial segment 2a, 2b of the first chrome web 2 or about the second chrome web 3.

In this case, a side length of the surface segment 5a or 5b corresponds in each case to a length of the partial segment 2a, 2b of the first chrome web 2, or to the length of the second chrome web 3 adjoined by the respective side of the surface segment 5a or 5b.

The surface segments 5a, 5b have different phases in this case. The surface segments 5a, 5b are preferably produced with the respective phases in the etching the glass plate forming the substrate 4 at an appropriate depth in the regions of the surface segments 5a, 5b.

The phases of the surface segments 5a, 5b are selected here such that in each case two opposite surface segments 5a, 5b are phase displaced by an angle of 180° $\pm \Delta \alpha$. The angular offset $\Delta \alpha$ is in this case at most approximately $\Delta \alpha = 25°$. In the exemplary embodiments illustrated in the figures, the angular offset $\Delta \alpha = 0$.

In the case of the exemplary embodiment illustrated in FIG. 1, two of the surface segments 5a in each case have a phase of 180°, that is to say the laser light beams experience a phase-angle deviation of 180° upon passage of the laser light beams. In contrast, the two other surface segments 5b in each case have a phase of 0° that is identical to the phase of the substrate 4.

As may be seen from FIG. 1, the two lower surface segments 5a, 5b adjoin the chrome layer 3 with two lateral surfaces in each case. However, the two upper surface segments 5a, 5b are situated opposite one another with a lateral surface in each case, without there being a chrome layer disposed therebetween.

According to the invention, a transparent surface boundary segment 6 is provided between the two surface segments 5a, 5b. The surface boundary segment 6 has a rectangular cross section and extends along a straight line along which the second chrome web 3 also runs. A width of the surface boundary segment 6 also corresponds to a width of the second chrome web 3.

A length of the surface boundary segment 6 corresponds to the lengths of the adjacent sides of the surface segments 5a, 5b.

A phase of the surface boundary segment 6 is between the phases of the adjacent surface segments 5a, 5b. The phase of the surface boundary segment 6 preferably corresponds to the arithmetic mean of the phases of the surface segments 5a, 5b adjacent thereto.

In the present exemplary embodiment, the phases of the adjacent surface segments 5a, 5b are 0° and 180°, respectively, and so the phase of the surface boundary segment 6 is 90°. Alternatively, the phase can also be 90°+n·180°, n being a positive whole number.

The configuration thus formed forms an alternating phase mask 1 in which, in each case, adjacent transparent surface segments 5a, 5b separated by an opaque chrome layer have phases displaced by 180°.

The surface boundary segment 6 prevents the surface segments 5a, 5b, which are situated opposite one another and opposite the longitudinal side of the first chrome web 2, from adjoining one another indirectly. An abrupt phase change of 180° is thus prevented by the interposition of the surface boundary segment 6. Rather, it is in each case only sudden phase changes of 90° that occur at the boundary lines of the surface boundary segment 6. This prevents the laser light beams from being canceled by interference effects at the boundary between the surface segments 5a, 5b, and so an exposure of the respective resist structure also takes place in the region.

Figure 2:
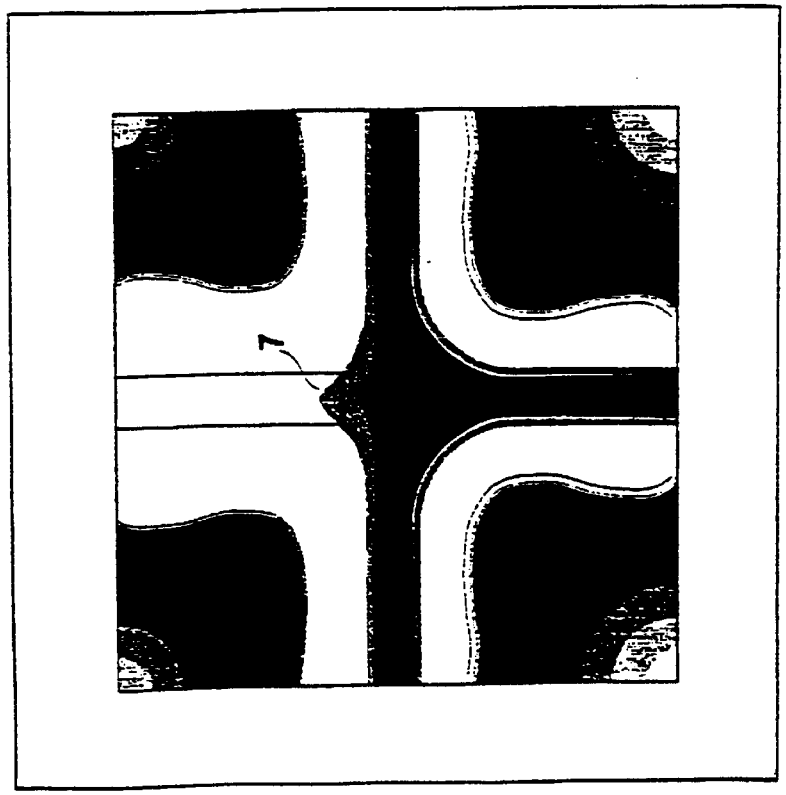
FIG. 2 is a schematic view of an exposure structure, obtained with an aid of the phase mask in accordance with FIG. 1, on a resist layer.

FIG. 2 shows a schematic of the exposure pattern of a resist layer that is obtained with the aid of the alternating phase mask 1 in accordance with FIG. 1. The bright regions mark the exposed points. The dark regions mark the non-exposed points. It can be seen from FIG. 2 that an image with very high contrast is obtained with the aid of the phase mask 1 according to the invention. The T-shaped structure of the chrome segments contrasts clearly and accurately in terms of contour as a non-exposed zone from the surrounding exposed zones. In particular, there is a very strong exposure of the resist layer in the region of the surface boundary segment 6 as well.

A small tongue-shaped swelling 7 of the non-exposed zone extends only in a region of the center of the upper edge of the T-shaped structure. The widening of the non-exposed zone at this point is based on the cross-sectional widening of the first chrome web 2 at the end of the second chrome web 3.

Figure 3:
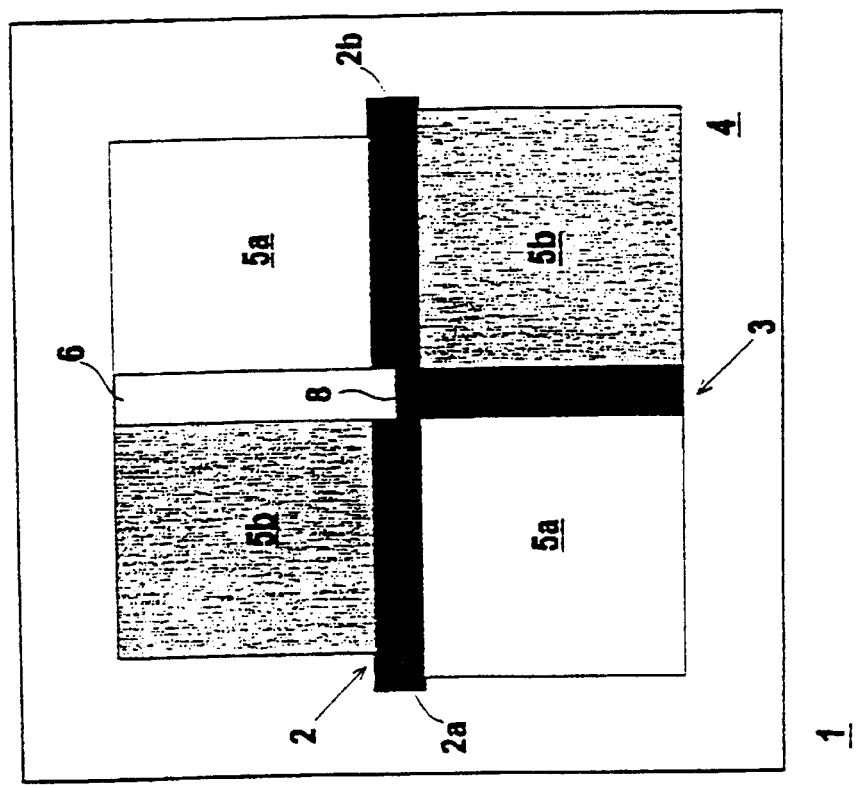
FIG. 3 is a top plan view of a section of a second exemplary embodiment of the phase mask.

FIG. 3 shows a second exemplary embodiment of the phase mask 1 according to the invention. The structure of the phase mask 1 corresponds essentially to the structure of the phase mask 1 in accordance with FIG. 1.

In contrast with the phase mask 1 shown in FIG. 1, the phase mask 1 shown in FIG. 3 has surface segments 5a, 5b with phases of 90° and 270°, which are disposed in an alternating fashion with reference to the individual chrome layers. The surface boundary segment 6, which is situated between the surface segments 5a, 5b with phases of 90° and 270°, has a phase of 0° corresponding to the substrate 4.

A further difference from the phase mask 1 in accordance with FIG. 1 relates in that, in the case of the phase mask 1 in accordance with FIG. 3, the first chrome web 2 has an indentation 8 at its longitudinal side forming the upper edge of the T-shaped structure. The indentation 8 is disposed opposite the end of the second chrome web 3 at the longitudinal side of the first chrome web 2. The width of the indentation 8 corresponds in this case to the width of the second chrome web 3.

Figure 4:
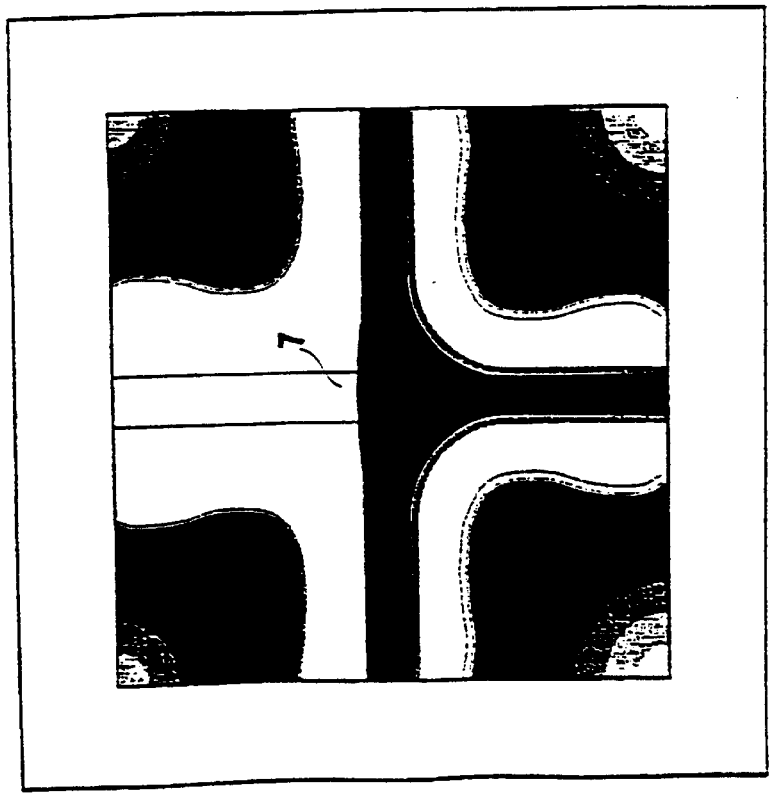
FIG. 4 is a schematic view of the exposure structure, obtained with the phase mask in accordance with FIG. 3, on the resist layer.

FIG. 4 shows a schematic of the exposure pattern of a resist layer that is obtained with the aid of the alternating phase mask 1 in accordance with FIG. 3. The exposure pattern is virtually identical to the exposure pattern in accordance with FIG. 2.

The sole difference between the exposure patterns consists in that, owing to the indentation 8 in the first chrome web 2 of the phase mask 1 in accordance with FIG. 1, the tongue-shaped swelling 7 no longer occurs on the top side of the non-exposed zone produced by the T-shaped structure of the opaque segments 2, 3.

The surface boundary segment 6 contains a transparent zone with a homogeneous phase in the present exemplary embodiments. In principle, the surface boundary segment 6 can also be subdivided into a plurality of zones of different phase, it also being possible for the phase to vary continuously in the limiting case.

We claim:

1. An alternating phase mask for exposing a photosensitive layer in a photolithographic process, the alternating phase mask comprising:
    at least two opaque segments including a first opaque segment with a longitudinal side and a second opaque segment ending at the longitudinal side of the first opaque segment, the second opaque segment subdividing the first opaque segment into two opaque partial segments on either side of an end region of the second opaque segment;
    transparent surface segments, one of the transparent surface segments disposed on each side of each of the two opaque partial segments and of the second opaque segment and extending over an entire length of the opaque segments, mutually adjacent ones of the transparent surface segments in each case having phases displaced by $180°\pm\Delta\alpha$ with respect to each other, and $\Delta\alpha$ being at most 25°; and
    a surface boundary segment disposed between two of the transparent surface segments and having a phase situated between the phases of the two of the transparent surface segments, the transparent surface segments separated by the surface boundary segment and situated opposite of the longitudinal side of the first opaque segment having the phases displaced by $180°\pm\Delta\alpha$ with respect to each other, the
    surface boundary segment having a shape of an elongated rectangle with a width being substantially equivalent to a width of the second opaque segment.

2. The alternating phase mask according to claim 1, wherein the two opaque segments complement one another and form a T-shaped structure.

3. The alternating phase mask according to claim 2, wherein the T-shaped structure has a magnitude G where $G=0.3\cdot\lambda/NA$, $\lambda$ being a wavelength of radiation used in an exposure, and NA being a numerical aperture of an imaging system used for the exposure.

4. The alternating phase mask according to claim 3, wherein the two opaque segments each have a shape of an elongated rectangle.

5. The alternating phase mask according to claim 2, wherein the first opaque segment at a side opposite the end region of the second opaque segment has an indentation formed therein extending over a width of the end region.

6. The alternating phase mask according to claim 2, wherein the transparent surface segments have a rectangular cross-section.

7. The alternating phase mask according to claim 6, wherein the transparent surface elements have lengths corresponding in each case to lengths of adjacent ones of the two partial opaque segments.

8. The alternating phase mask according to claim 1, wherein the two opaque segments are chrome webs.

9. The alternating phase mask according to claim 1, wherein the $\Delta\alpha=0°$.

10. The alternating phase mask according to claim 9, wherein the phases of the transparent surface segments are selected from the group consisting of 0° and 180°.

11. The alternating phase mask according to claim 10, wherein the phase of the surface boundary segment is 90°.

12. The alternating phase mask according to claim 9, wherein the phases of the transparent surface segments are selected from the group consisting of 90° and 270°.

13. The alternating phase mask according to claim 12, wherein the phase of the surface boundary segment is 0°.

14. The alternating phase mask according to claim 1, wherein the surface boundary segment transverse to boundary surfaces of adjacent ones of the transparent surface segments is divided up into partial segments having different phases.

15. The alternating phase mask according to claim 1, wherein the surface boundary segment has a homogeneous phase.

16. The alternating phase mask according to claim 1, wherein the surface boundary segment has a length adapted to lengths of adjacent ones of the transparent surface segments.

* * * * *